US006788087B2

United States Patent
Schnabel

(10) Patent No.: US 6,788,087 B2
(45) Date of Patent: Sep. 7, 2004

(54) INTEGRATED CIRCUIT HAVING A TEST CIRCUIT, AND METHOD OF DECOUPLING A TEST CIRCUIT IN AN INTEGRATED CIRCUIT

(75) Inventor: Rainer Florian Schnabel, Höhenkirchen (DE)

(73) Assignee: Infineon Technologies AG, Munich (DE)

( * ) Notice: Subject to any disclaimer, the term of this patent is extended or adjusted under 35 U.S.C. 154(b) by 107 days.

(21) Appl. No.: 10/289,826

(22) Filed: Nov. 7, 2002

(65) Prior Publication Data
US 2003/0085725 A1 May 8, 2003

(30) Foreign Application Priority Data

Nov. 7, 2001 (DE) .......................................... 101 54 614

(51) Int. Cl.[7] ............................................... G01R 31/02
(52) U.S. Cl. ................... 324/763; 365/189.01
(58) Field of Search ................. 324/755, 764, 324/765, 527, 508, 76.35, 158.1, 73.1; 710/26; 365/189.01, 201, 230.01

(56) References Cited

U.S. PATENT DOCUMENTS 5,911,039 A * 6/1999 Hashizume et al. .......... 714/30
6,552,960 B2 * 4/2003 Shirai et al. ................. 365/233

FOREIGN PATENT DOCUMENTS

DE  42 23 532 A1  1/1994

* cited by examiner

*Primary Examiner*—Ernest Karlsen
*Assistant Examiner*—Trung Q. Nguyen
(74) *Attorney, Agent, or Firm*—Laurence A. Greenberg; Werner H. Stemer; Gregory L. Mayback

(57) ABSTRACT

The integrated circuit has a test circuit, which is connected to an input terminal of the integrated circuit via a line connection. An isolating device is provided between an input terminal of the test circuit in order to completely isolate the line connection between the test circuit and the input terminal after the test circuit has performed a test procedure.

16 Claims, 3 Drawing Sheets

INTEGRATED CIRCUIT HAVING A TEST CIRCUIT, AND METHOD OF DECOUPLING A TEST CIRCUIT IN AN INTEGRATED CIRCUIT

BACKGROUND OF THE INVENTION

Field of the Invention

The invention lies in the field of integrated technology. More specifically, the invention relates to an integrated circuit having a test circuit, and to a method for decoupling the test circuit in an integrated circuit.

During the manufacturing process of integrated circuits, such as e.g. DRAMs, a series of test measurements are necessary by means of which the functionality of the integrated circuits is checked. The tests are typically carried out after the completion of certain integration stages, e.g. after wafer production at the wafer level, after encapsulation at the component level and also in the finished system. Constituent parts of the tests usually comprise the plumbing of parameter windows, the replacement of defective circuit parts by redundant elements and also the tuning and retuning of electrical parameters with the aid of fuse devices.

The test procedures are carried out by connecting the integrated circuit to a tester device. However, in order to be able to carry out the test procedure, a series of test switching elements implemented in the integrated circuit are required. In this case, the test switching elements are usually required only for the test procedure and not in later operation in the end device. In order to save chip area and input terminals, however, the same input terminals and lines that are used for operating the circuits are used for driving the test switching elements. This has the consequence that the test switching elements impair the function of the circuits during operation because they capacitively load the lines used and consume power in the later application.

An example that may be mentioned is a current defined as IDD2N by JEDEC. The current IDD2N relates to DRAM semiconductor memories, in the case of which the semiconductor memory is in the so-called bank idle state, i.e. data are neither read from the semiconductor memory nor written to the semiconductor memory. The current IDD2N must not exceed a specific value. However, the command and address terminals of the integrated circuit are connected to a common command and address bus. In other words, even when an integrated circuit is not activated, there are applied to the input terminals signals which alternate between high states and low states but which are correspondingly intended only for one of the memory modules connected to the bus lines.

The command and address lines are typically connected to a series of test circuits. These test circuits are required for setting test modes, decoding trimming values and the like. The test circuits that are connected to the address terminals and are partly active lead to an increased capacitive load and cause an increased current IDD2N in the case of signal transitions at the address terminals. The current consumption IDD2N is intended to be kept as small as possible, however, because the maximum frequency of the command and address signals that can be achieved is reduced with larger current IDD2N.

SUMMARY OF THE INVENTION

It is accordingly an object of the invention to provide an integrated circuit which overcomes the above-mentioned disadvantages of the heretofore-known devices and methods of this general type and which provides for an integrated circuit wherein the load on signal lines by the test circuits is reduced.

With the foregoing and other objects in view there is provided, in accordance with the invention, an integrated circuit, comprising:

at least one functional circuit;

a test circuit for testing the functional circuit in a test procedure;

a signal line connecting the test circuit to the functional circuit; and an isolating device connected in the signal line for physically isolating the signal line after an operation of the test circuit in the test procedure.

With the above and other objects in view there is also provided, in accordance with the invention, a decoupling method, which comprises the following steps:

providing an integrated circuit having a test circuit connected via a signal line;

initiating a test procedure in the integrated circuit with a test mode signal for the test circuit;

testing the integrated circuit with the test circuit;

terminating the test procedure; and permanently interrupting a signal line with which the test circuit is connected.

In other words, the invention provides an integrated circuit having a test circuit, which is connected to circuits of the integrated circuit via a signal line. An isolating device is provided in the signal line in order to physically, i.e. completely, isolate the signal line after the operation of the test circuit in a test procedure.

One advantage of the present invention is that an integrated circuit is provided with the possibility of completely disconnecting the test circuit from the corresponding signal lines once it is no longer required for a test procedure or the like. Complete isolation is to be understood preferably not as a controlled switching, but rather as a galvanic isolation such as e.g. an interruption of a connecting line.

What can be achieved in this way is that the test circuit or associated circuit parts are no longer connected as load to the corresponding input terminals if they are not needed again during conventional operation of the integrated circuit. Compared with an electrical isolation by a switchable semiconductor element, such as e.g. a transistor, the advantage in a complete (galvanic) isolation is that essentially no capacitive load on account of the connected test circuits remains on the signal lines. In contrast to this, with a transistor as isolating element, there is always a capacitance formed by the active semiconductor junction area.

Preferably, the isolating device is situated at addressing, data or command terminals of a semiconductor memory or of a logic circuit and/or at one or more of the supply voltage terminals. The isolating device is preferably configured in such a way that it has a fuse device. Fuse devices are quite generally provided in order to effect settings for an integrated circuit, they are used, for example, for replacing defective memory cells by redundant memory cells, by setting parameters in the integrated circuit, or the like. The fuse device may have, for example, a laser fuse and/or an electrical fuse. Laser fuses are initially closed connections which are interrupted with the aid of a laser beam. In the case of electrical fuses, an interconnect is severed by electric current in the fuse process by applying a high voltage. The use of a fuse device has the advantage that a complete physical isolation of a line connection can be carried out, so that only a very small, negligible residual capacitance remains.

A further aspect of the present invention provides a method for decoupling a test circuit in an integrated circuit. After the starting of a test procedure in the integrated circuit by provision of a test mode signal for the test circuit e.g. by a test device, the integrated circuit is tested. After the ending of the test procedure, a signal line which connects the test circuit to one or more signal lines is permanently interrupted.

What is thereby achieved is that the test circuit is permanently and completely isolated from the input terminals and the rest of the circuits in the integrated circuit. In this way, the capacitive load which a test circuit connected to a signal line exerts on the signal line can be considerably reduced.

Preferably, the isolation of the signal line by e.g. a programming current is carried out substantially in temporal proximity to or in the same process step wherein a further line is interrupted by an isolating device in the integrated circuit. This enables the interruption of signal lines to be integrated into an already existing process of interruption of lines by isolating devices, e.g. fuse devices, so that a possibly time-consuming additional method step can be avoided. Moreover, in the same process step wherein the isolation of the signal line is carried out, a connecting device for producing a line connection, in particular an antifuse device, can also be through-connected. Antifuses are through-connected by applying a programming current, i.e. antifuses are initially nonconducting and are turned into a conducting connection by application of a programming current.

It may be provided that, in a process step during the fabrication of a memory circuit wherein fuse devices are separated for replacing defective memory blocks by redundant memory blocks, the signal lines to which a test circuit for ascertaining the defective memory blocks is connected are simultaneously interrupted.

Other features which are considered as characteristic for the invention are set forth in the appended claims.

Although the invention is illustrated and described herein as embodied in an integrated circuit having a test circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
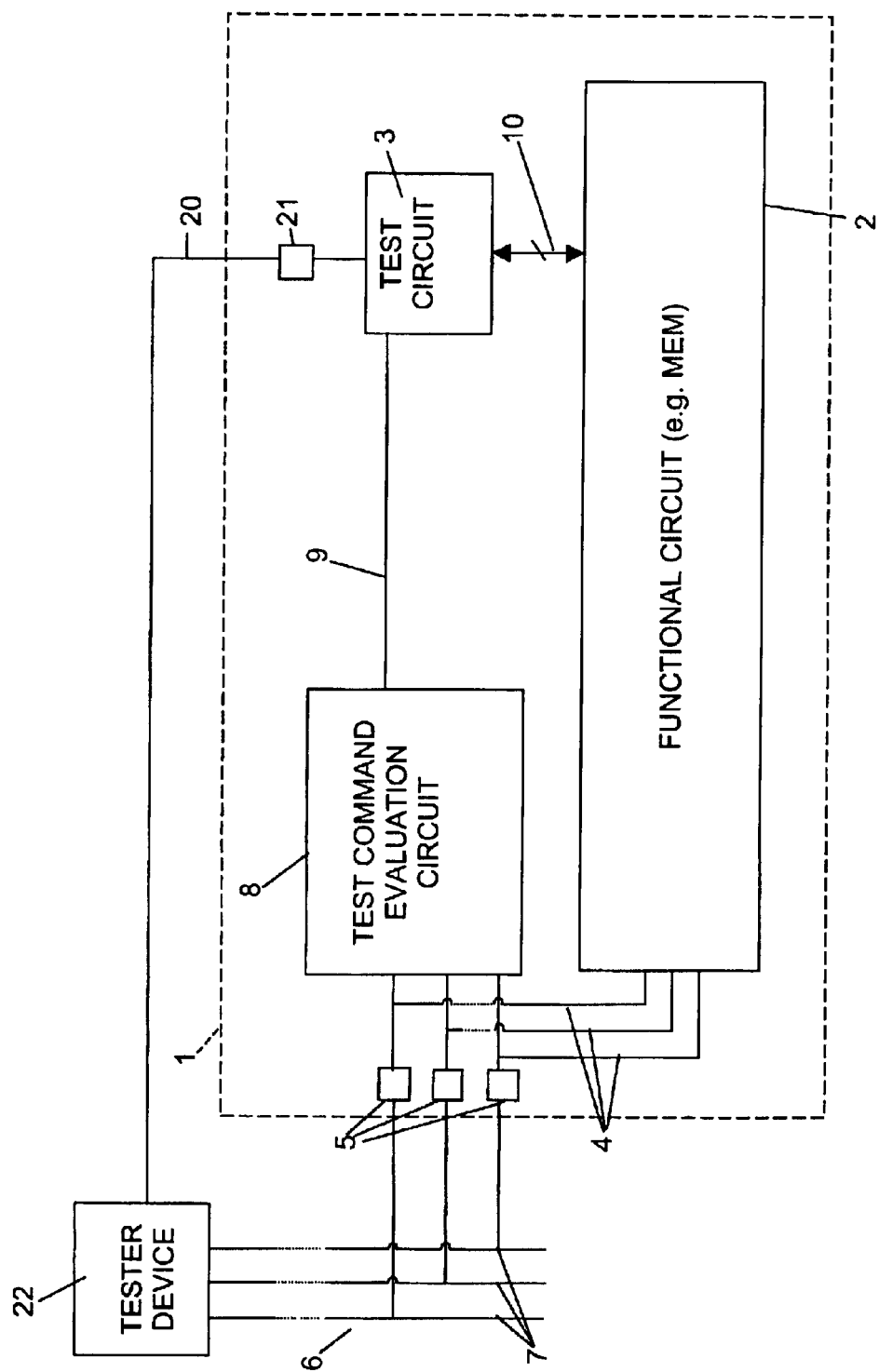
FIG. 1 is a diagram of an integrated circuit with a test mode coding device that is connected to signal lines of the integrated circuit.

Referring now to the figures of the drawing in detail and first, particularly, to FIG. 1 thereof, there is shown an integrated circuit 1 having a memory circuit 2, e.g. a DRAM circuit, and a test circuit 3. The memory circuit 2 is connected to pads 5 via signal lines 4. Memory cells in the memory circuit 2 can be addressed by means of address data which are applied to the pads 5. The pads are connected via external lines to an address bus 6 having bus lines 7. Instead of the memory circuit 2, other logic circuits which are connected via signal lines e.g. to pads are also conceivable. All of these possible types of circuits are generically referred to as a functional circuit 2 of the integrated memory 1.

The signal lines 4 are likewise connected to a test command evaluation circuit 8. The test command evaluation circuit 8 signals to the test circuit 3 via the signal line 9 that a test procedure is to be carried out. For this, the test circuit 3 is connected to the memory circuit 2 via one or more test lines 10. The test lines 10 are embodied such that the test circuit 3 can address the memory circuit and/or can write data to the memory circuit and read data from the memory circuit 2.

While the test sequence is being carried out, the test circuit 3 can identify defects of the memory circuit 2 and output them via further signal lines 20 and/or pads 21 e.g. to an externally connected tester device 22, or else via the test command evaluation circuit 8, the signal line 4 and the bus lines 7. The test procedure in the test circuit 3 is started when the test command evaluation circuit 8 recognizes, by means of a specific signal combination on the signal lines 4, that a test procedure is now to be started. The specific signal combination on the signal lines 4 is applied externally, e.g. by the test device 22.

During normal operation of this circuit, signal combinations which can activate the test circuit 3 are not usually applied to the pads 5. In this state, only the memory circuit 2 is operated, while the test circuit 3 performs no function. The test command evaluation circuit 8 is still connected to the pads 5 and evaluates the signals present at the pads 5. During normal operation, however, the signals present at the pads 5 are provided such that the test command evaluation circuit 8 does not recognize a test command.

Thus, during the operation of the memory circuit 2, the test command evaluation circuit 8 is always applied to the pads 5, so that not only input circuits situated in the memory circuit 2 but also input circuits of the test command evaluation circuit 8 have to be driven via the bus lines 7. This requires an increased driver power of the corresponding drivers which drive signals onto the bus lines 7. Since the driver strength of the drivers cannot be set at an arbitrary magnitude for space reasons and for power consumption reasons, the number of input circuits connected to a pad thus governs the maximum frequency of the transmission of signals on the bus lines 7.

Figure 2:
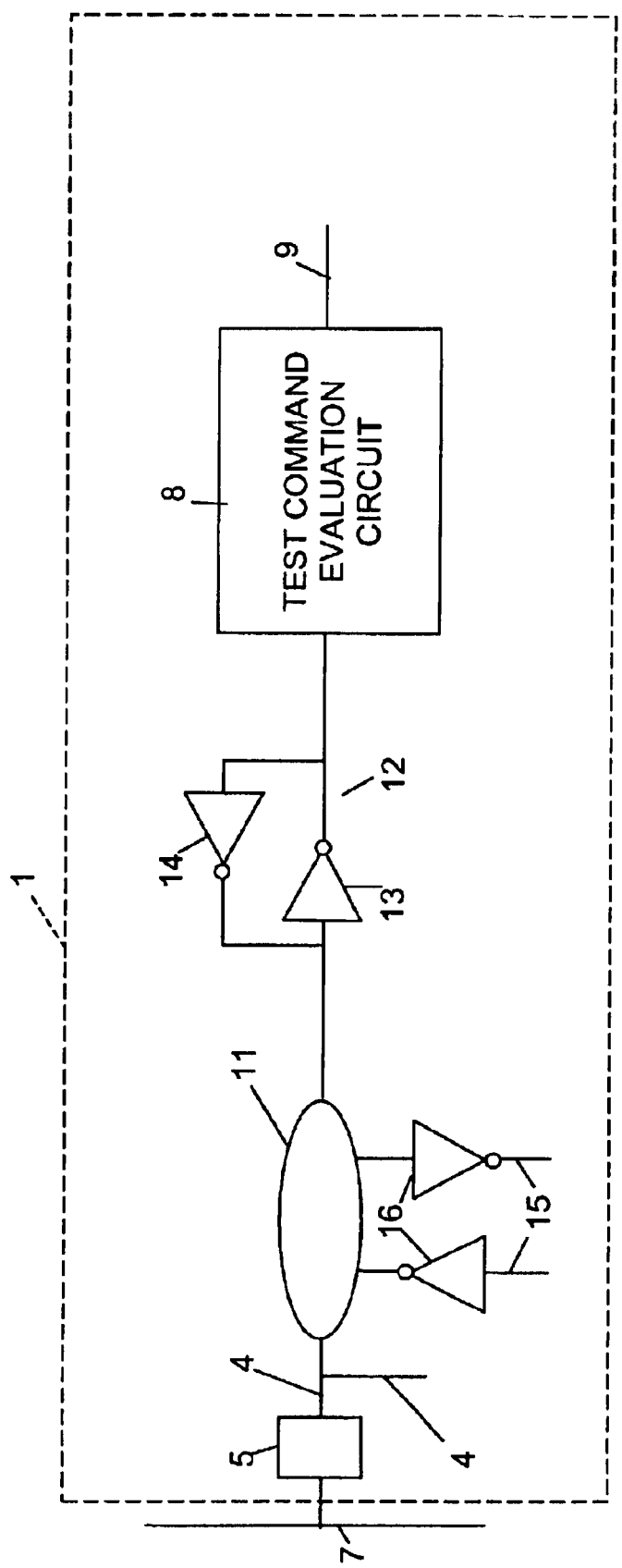
FIG. 2 is a diagram of a test circuit that is connected to an input terminal via a line connection into an isolating device.

This can be avoided if the test command evaluation circuit 8 is isolated from the signal line 4 after the use of the test circuit 3 and after the conclusion of the test procedure. This can be done for example in accordance with a preferred embodiment corresponding to the block diagram of FIG. 2. FIG. 2 shows a detail from the integrated circuit 1 according to the invention with a pad 5 connected to a bus line 7. The pad 5 is connected to the signal line 4 and, via a fuse 11 and a latch 12, to the test command evaluation circuit 8. The bus line 7 may be an address line, data line or some other signal line.

The latch 12 is preferably formed by a first inverter 13 and a second inverter 14. The first inverter 13 and the second inverter 14 are connected up in such a way that the output of the first inverter 13 is connected to the test command evaluation circuit 8 and to an input of the second inverter 14. An output of the second inverter 14 is connected to the input of the first inverter 13.

Initially, i.e. before and during a test procedure, the fuse device 11 constitutes an electrical connection between the pad 5, the signal line 4 and the input of the first inverter 13 of the latch 12. After the conclusion of the test procedure, the test command evaluation circuit 8 is no longer required and the fuse device 11 is isolated by a corresponding isolating procedure. To that end, programming lines 15 are connected to the fuse device 11 and can impress a specific isolating current into the fuse device 11 via driver stages 16.

In order that the data outputs of the memory circuit 2 are also loaded with the smallest possible capacitance on the test lines 10, the test lines 10 can also be provided with a permanently interruptible isolating device. Preferably, all of the signal lines which connect the test circuit 3 to the rest of the circuits can thus be interrupted.

After the test procedure, the fuse device 11 is melted through with the aid of the programming lines 15 in that the driver stages 16 impress into the fuse device an isolating current which exceeds the current-carrying capacity of the fuse device 11. With the blowing of the fuse device 11, the connection between the pad 5 and the input of the latch 12 is permanently interrupted and cannot subsequently be reestablished, or can subsequently be reestablished only with a comparatively high outlay. The ends of the interconnect which are opposite one another in the fuse device 11 have only a small capacitive load for the pad 5 which is quite generally negligible.

In addition to the fuse device, the integrated circuit can provide further fuse devices (not shown) which are provided after a test procedure, e.g. for replacing a defective memory region of the memory device by a redundant memory region provided. In this case, it is advantageous to carry out the interruption of the further fuse devices at the same time as the interruption of the fuse device L in order thus to save the time for a fuse programming procedure additionally taking place.

It is equally possible also to provide antifuse devices which can be programmed with the aid of a programming current, the antifuse device being changed by the programming current from an initially high-impedance state to a conducting state. With the aid of a suitable circuit, these antifuses can also be used for replacing a defective memory region by a redundant memory region. The antifuse devices can likewise be programmed in the same method step wherein the fuse devices are also severed.

The fuse device 11 may also be formed by a laser fuse which is interrupted in a laser cutting process preferably at the same time as or in temporal proximity to the blowing of other fuses in the integrated circuit.

Figure 3:
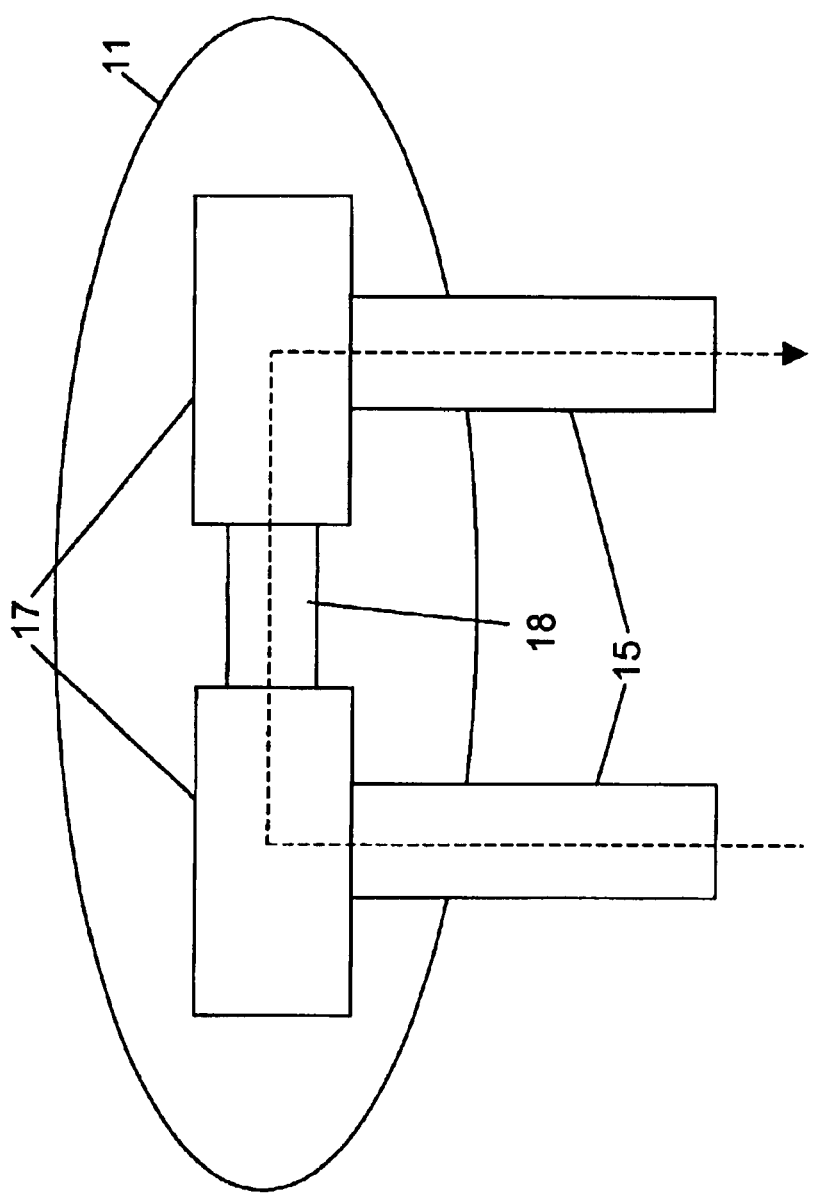
FIG. 3 is a diagram showing an embodiment of an isolating device according to FIG. 2.

The latch 12 is necessary in order to bring the input circuit of the test command evaluation circuit 8 to a defined potential in order to avoid a floating gate control. FIG. 3 shows, by way of example, a possible embodiment of the fuse 11 which can be interrupted via the programming lines 15. The fuse device 11 has two fuse areas 17 between which the interruptible interconnect 18 is arranged. As a result of a current flow, illustrated by the dashed arrow line, the region 18 to be interrupted is heated above its melting point and thereby melted through.

It goes without saying that it is also possible to use other fuse devices 11 which effect a permanent and complete isolation between the pad 5 and the test command evaluation circuit 8.

The features of the invention which are disclosed in the above description, the claims and the drawings may be essential to the realization of the invention in its various configurations both individually and in any desired combination.

I claim:

1. An integrated circuit, comprising:
   at least one functional circuit;
   a test circuit for testing said functional circuit in a test procedure;
   a signal line connecting said test circuit to said functional circuit; and
   an isolating device connected in said signal line for physically isolating said signal line after an operation of said test circuit in the test procedure.

2. The integrated circuit according to claim 1, which comprises an input terminal connected to said signal line, and wherein said signal line is selectively interruptible between said test circuit and said input terminal.

3. The integrated circuit according to claim 1, wherein said signal line is a connecting line selected from the group consisting of an address line, a data line, a command line, and a supply voltage line.

4. The integrated circuit according to claim 1, wherein said signal line includes a bus line connected to one or more further circuits, and said isolating device is arranged to exclusively isolate said test circuit from said bus line.

5. The integrated circuit according to claims 1, wherein said test circuit includes a test command evaluation circuit for ascertaining a test mode.

6. The integrated circuit according to claim 1, wherein said isolating device comprises a fuse device.

7. The integrated circuit according to claim 6, wherein said fuse device includes at least one fuse selected from the group consisting of a laser fuse and an electrical fuse.

8. The integrated circuit according to claim 1, wherein said isolating device is one of two isolating devices, and said two isolating devices are interruptible in a common step by application of a programming current.

9. The integrated circuit according to claim 8, wherein each of said two isolating devices is a fuse device.

10. The integrated circuit according to claim 1, which comprises a connecting device for producing a line connection, and wherein, by application of a programming current to said isolating device and to said connecting device, said isolating device is interrupted and said connecting device is through-connected in a common step.

11. The integrated circuit according to claim 10, wherein said connecting device is an antifuse device.

12. The integrated circuit according to claim 1, wherein said functional circuit is a memory circuit.

13. A decoupling method, which comprises the following steps:
    providing an integrated circuit having a test circuit connected via a signal line;
    initiating a test procedure in the integrated circuit with a test mode signal for the test circuit;
    testing the integrated circuit with the test circuit;
    terminating the test procedure; and
    permanently interrupting a signal line with which the test circuit is connected.

14. The method according to claim 13, wherein the step of permanently interrupting the signal line comprises irreversibly interrupting the signal line.

15. The method according to claim 13, which comprises permanently interrupting the signal line substantially concomitant with a process step in which a further line is interrupted or a line connection is produced in the integrated circuit.

16. The method according to claim 15, which comprises rendering one of the further line and the line connection through-connectable for replacing defective memory blocks by redundant memory blocks in a memory circuit.

* * * * *